(12) United States Patent
Yanase et al.

(10) Patent No.: US 9,362,366 B2
(45) Date of Patent: Jun. 7, 2016

(54) SEMICONDUCTOR ELEMENT, SEMICONDUCTOR ELEMENT MANUFACTURING METHOD, SEMICONDUCTOR MODULE, SEMICONDUCTOR MODULE MANUFACTURING METHOD, AND SEMICONDUCTOR PACKAGE

(71) Applicant: Panasonic Intellectual Property Management Co., Ltd., Osaka (JP)

(72) Inventors: Yasuyuki Yanase, Gifu (JP); Tsutomu Kiyosawa, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/428,289

(22) PCT Filed: Apr. 21, 2014

(86) PCT No.: PCT/JP2014/002239
§ 371 (c)(1),
(2) Date: Mar. 13, 2015

(87) PCT Pub. No.: WO2014/185010
PCT Pub. Date: Nov. 20, 2014

(65) Prior Publication Data
US 2015/0249133 A1    Sep. 3, 2015

(30) Foreign Application Priority Data

May 13, 2013    (JP) .................................. 2013-101275

(51) Int. Cl.
*H01L 29/15* (2006.01)
*H01L 29/16* (2006.01)
(Continued)

(52) U.S. Cl.
CPC ........ *H01L 29/1608* (2013.01); *H01L 21/0475* (2013.01); *H01L 21/0485* (2013.01);
(Continued)

(58) Field of Classification Search
CPC .................. H01L 2924/00; H01L 2924/00014; H01L 2224/32245; H01L 2224/48247; H01L 2224/73265; H01L 2224/05155; H01L 2224/05166; H01L 2224/05639; H01L 2224/48091; H01L 2224/92247; H01L 2224/94; H01L 2224/04026; H01L 2224/05017; H01L 2224/05018; H01L 2224/0508; H01L 2224/05557; H01L 2224/05558; H01L 2224/05564; H01L 2224/0558; H01L 2224/26145; H01L 2224/32013; H01L 2224/32058
USPC ........... 257/77, 94, 622, 751; 438/33, 39, 460
See application file for complete search history.

(56) References Cited

U.S. PATENT DOCUMENTS

| | | | |
|---|---|---|---|
| 5,972,730 A * | 10/1999 | Saito ..................... | H01S 5/0201 372/45.01 |
| 2005/0186760 A1* | 8/2005 | Hashimura ............ | B23K 26/18 438/460 |

(Continued)

FOREIGN PATENT DOCUMENTS

| | | |
|---|---|---|
| JP | 56-48142 A | 5/1981 |
| JP | 62-92604 U | 6/1987 |

(Continued)

OTHER PUBLICATIONS

International Search Report issued in International Application No. PCT/JP2014/002239 dated Jul. 24, 2014, with English translation.

*Primary Examiner* — Mohammed Shamsuzzaman
(74) *Attorney, Agent, or Firm* — McDermott Will & Emery LLP

(57) ABSTRACT

An ohmic electrode layer is disposed on a second main surface of a silicon carbide substrate, and a metal electrode layer is disposed on the ohmic electrode layer. A notch is formed along at least one pair of sides, facing each other, of a periphery of the second main surface of the silicon carbide substrate. The cross-section of the notch orthogonal to a side of the second main surface has a corner. In the cross-section, a thickness of the silicon carbide substrate at an edge thereof under which the notch is formed is smaller than a thickness of the silicon carbide substrate in a region under which the notch is not formed, and larger than a thickness of the silicon carbide substrate in a region under which a bottom of the corner is formed.

5 Claims, 15 Drawing Sheets

(51) Int. Cl.
  *H01L 29/06* (2006.01)
  *H01L 23/00* (2006.01)
  *H01L 21/78* (2006.01)
  *H01L 21/04* (2006.01)
  *H01L 21/306* (2006.01)
  *H01L 21/52* (2006.01)
  *H01L 23/495* (2006.01)
  *H01L 29/872* (2006.01)
  *H01L 21/48* (2006.01)
  *H01L 21/304* (2006.01)
  *H01L 21/3065* (2006.01)
  *H01L 29/45* (2006.01)
  *H01L 29/66* (2006.01)
  *H01L 23/373* (2006.01)
  *H01L 21/683* (2006.01)
  *H01L 29/861* (2006.01)

(52) U.S. Cl.
  CPC ........ *H01L21/3043* (2013.01); *H01L 21/3065* (2013.01); *H01L 21/30604* (2013.01); *H01L 21/48* (2013.01); *H01L 21/52* (2013.01); *H01L 21/78* (2013.01); *H01L 23/49513* (2013.01); *H01L 23/49562* (2013.01); *H01L 24/83* (2013.01); *H01L 24/85* (2013.01); *H01L 24/91* (2013.01); *H01L 29/0657* (2013.01); *H01L 29/6606* (2013.01); *H01L 29/872* (2013.01); *H01L 21/6836* (2013.01); *H01L 23/3735* (2013.01); *H01L 24/32* (2013.01); *H01L 24/48* (2013.01); *H01L 24/73* (2013.01); *H01L 29/45* (2013.01); *H01L 29/66068* (2013.01); *H01L 29/861* (2013.01); *H01L 2221/68327* (2013.01); *H01L 2224/04026* (2013.01); *H01L 2224/0508* (2013.01); *H01L 2224/05017* (2013.01); *H01L 2224/05018* (2013.01); *H01L 2224/0558* (2013.01); *H01L 2224/05155* (2013.01); *H01L 2224/05166* (2013.01); *H01L 2224/05557* (2013.01); *H01L 2224/05558* (2013.01); *H01L 2224/05564* (2013.01); *H01L 2224/05624* (2013.01); *H01L 2224/05639* (2013.01); *H01L 2224/26145* (2013.01); *H01L 2224/291* (2013.01); *H01L 2224/293* (2013.01); *H01L 2224/2929* (2013.01); *H01L 2224/32013* (2013.01); *H01L 2224/32058* (2013.01); *H01L 2224/32227* (2013.01); *H01L 2224/32245* (2013.01); *H01L 2224/48091* (2013.01); *H01L 2224/48247* (2013.01); *H01L 2224/73265* (2013.01); *H01L 2224/83192* (2013.01); *H01L 2224/83365* (2013.01); *H01L 2224/85399* (2013.01); *H01L 2224/92247* (2013.01); *H01L 2224/94* (2013.01); *H01L 2924/00014* (2013.01); *H01L 2924/10155* (2013.01); *H01L 2924/10158* (2013.01); *H01L 2924/12032* (2013.01); *H01L 2924/13091* (2013.01); *H01L 2924/351* (2013.01); *H01L 2924/35121* (2013.01)

(56) References Cited

U.S. PATENT DOCUMENTS

| | | | | |
|---|---|---|---|---|
| 2008/0121906 A1* | 5/2008 | Yakushiji | ............ | H01L 33/0095 257/94 |
| 2010/0207125 A1* | 8/2010 | Uchida | ............... | H01L 21/0485 257/77 |
| 2012/0156816 A1* | 6/2012 | Okamura | ........... | B23K 26/0057 438/33 |
| 2012/0187547 A1* | 7/2012 | Nemoto | ................ | H01L 21/304 257/622 |
| 2014/0138833 A1* | 5/2014 | Seng | ................... | H01L 29/0657 257/751 |

FOREIGN PATENT DOCUMENTS

| | | | |
|---|---|---|---|
| JP | 02-253642 | A | 10/1990 |
| JP | 03-45668 | U | 4/1991 |
| JP | 04-335551 | | 11/1992 |
| JP | 5-182997 | A | 7/1993 |
| JP | 06-177178 | A | 6/1994 |
| JP | 7-115100 | A | 5/1995 |
| JP | 09-283738 | A | 10/1997 |
| JP | 10-081599 | A | 3/1998 |
| JP | 11-003804 | A | 1/1999 |
| JP | 2001-085736 | A | 3/2001 |
| JP | 2006-156658 | A | 6/2006 |
| JP | 2010-021251 | A | 1/2010 |
| JP | 2010-118573 | A | 5/2010 |
| JP | 4690485 | B2 | 6/2011 |
| WO | 03/088319 | A2 | 10/2003 |

* cited by examiner

SEMICONDUCTOR ELEMENT, SEMICONDUCTOR ELEMENT MANUFACTURING METHOD, SEMICONDUCTOR MODULE, SEMICONDUCTOR MODULE MANUFACTURING METHOD, AND SEMICONDUCTOR PACKAGE

RELATED APPLICATIONS

This application is the U.S. National Phase under 35 U.S.C. §371 of International Application No. PCT/JP2014/002239, filed on Apr. 21, 2014, which in turn claims the benefit of Japanese Application No. 2013-101275, filed on May 13, 2013, the disclosures of which are incorporated by reference herein.

TECHNICAL FIELD

The present disclosure relates to semiconductor elements including a silicon carbide substrate, and methods of manufacturing such semiconductor elements.

BACKGROUND ART

Silicon carbide (SiC) is a high-hardness semiconductor material having a band gap larger than that of silicon (Si), and is applied to various semiconductor devices such as a power element, an environmentally-resistant element, a high-temperature operation element, and a high-frequency element. Among these elements, application to power elements, such as a switching element and a rectifier element, is gaining attention. Power elements using SiC have an advantage that they can significantly reduce power loss, compared to power elements using Si.

Typical switching elements among power elements using SiC are a metal-oxide-semiconductor field-effect transistor (MOSFET) and a metal-semiconductor field-effect transistor (MESFET). Such switching elements can switch between an on-state where a drain current of several amperes (A) or more flows and an off-state where no drain current flows based on a voltage applied to a gate electrode. The elements using SiC can achieve a high breakdown voltage of several hundreds (V) or more in the off-state. Schottky diodes and pn diodes have been also reported as the rectifier elements, and have been expected as the rectifier elements that can achieve a large current and high breakdown voltage.

Many of such power elements have a structure in which a current flows in the front-back direction of surfaces of a substrate. In most of the structures, the front surface is patterned using a photoresist whereas an ohmic junction is substantially entirely formed on the back surface.

When such power elements are modularized, an electrode on a back surface thereof and an interconnect layer of a module substrate are connected together through a conductive material such as solder to form a bonded portion on the entire surface. Therefore, during an operation, a thermal stress is applied according to a thermal expansion coefficient difference between a power element (Si, SiC, GaN, etc.) and an interconnect layer material (mainly copper, etc.), posing a problem in reliability of the bonded portion.

In order to improve reliability of the bonded portion, a method has been considered in which a part of a back surface of a substrate which corresponds to the outer peripheral portion of a chip is half-cut with a dicer to a recess in advance before dicing is performed, and the recess is filled with solder when dicing and mounting are performed, thereby increasing the thickness of a region of the solder layer around the outer peripheral portion of the chip to improve reliability of the bonded portion (see Patent Documents 1 and 2).

CITATION LIST

Patent Document

PATENT DOCUMENT 1: Japanese Unexamined Patent Publication No. 556-48142
PATENT DOCUMENT 2: Japanese Unexamined Patent Publication No. H06-177178

SUMMARY OF THE INVENTION

Technical Problem

In a semiconductor element including a silicon carbide substrate, a metal electrode layer (for example, a stacked electrode of Ti/Ni/Ag) formed over the back surface thereof is disadvantageously likely to be delaminated from an ohmic electrode layer formed on the substrate. For example, when a wafer is diced by dicing, a large stress is applied to an interface between the soft metal layer and the solid semiconductor element in the bonded portion between the electrode over the back surface and the back surface of the semiconductor element. This is a cause of the delamination of the electrode over the back surface. When the semiconductor element is modularized, a stress is applied to the interface where the difference in thermal expansion coefficient is largest, resulting in the delamination of the electrode disposed over the back surface. Thus, if there is a reason for delamination of a metal electrode layer, the delamination proceeds due to a thermal stress in the manufacturing process thereof, and in some cases, the metal electrode layer is entirely delaminated from the back surface.

Patent Documents 1 and 2 described above considered improvement of reliability of the bonded portion by increasing the thickness of a solder layer. However, they fail to consider, in a semiconductor element including a silicon carbide substrate, the issue of bonding reliability between an electrode over the back surface and the back surface of the semiconductor element, i.e., the delamination issue of the metal electrode over the back surface, as described above.

The present disclosure can provide a semiconductor element including a silicon carbide substrate, the semiconductor element being capable of reducing delamination of a metal electrode layer disposed over a back surface of the substrate.

Solution to the Problem

A semiconductor element disclosed in the present specification includes a silicon carbide substrate having a first main surface and a second main surface, a silicon carbide layer disposed on the first main surface of the silicon carbide substrate, an ohmic electrode layer disposed on the second main surface of the silicon carbide substrate, and a metal electrode layer disposed on the ohmic electrode layer, wherein a notch is formed along at least one pair of sides, facing each other, of a periphery of the second main surface of the silicon carbide substrate, the ohmic electrode layer and the metal electrode layer are disposed in a region ranging from a position on the second main surface to a surface of the notch, a cross-section of the notch orthogonal to each of the sides has a corner, and in the cross-section, a thickness of the silicon carbide substrate at an edge thereof under which the notch is formed is smaller than a thickness of the silicon carbide substrate in a region under which the notch is not formed, and larger than a thickness of the silicon carbide substrate in a region under which a bottom of the corner is formed.

Advantages of the Invention

The technique disclosed in this specification can reduce, in a semiconductor element including a silicon carbide substrate, delamination of a metal electrode layer disposed over the back surface of the substrate.

DESCRIPTION OF EMBODIMENTS

Figure 1:
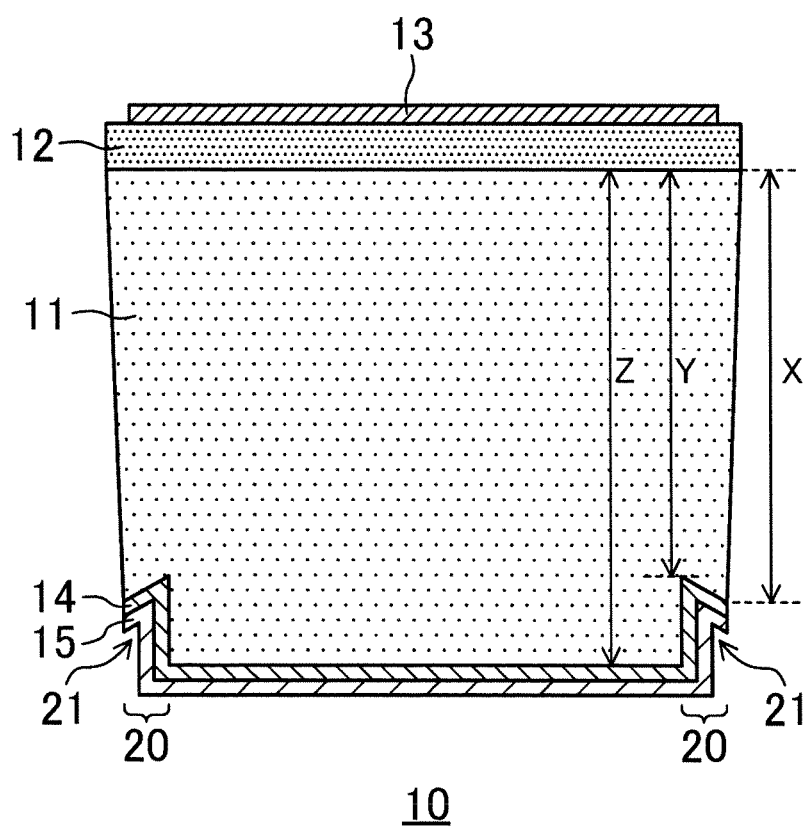
FIG. 1 is a cross-sectional view schematically illustrating a configuration of a semiconductor element in an example embodiment of the present disclosure.

In a first aspect of the present disclosure, a semiconductor element includes a silicon carbide substrate having a first main surface and a second main surface, a silicon carbide layer disposed on the first main surface of the silicon carbide substrate, an ohmic electrode layer disposed on the second main surface of the silicon carbide substrate, and a metal electrode layer disposed on the ohmic electrode layer. A notch is formed along at least one pair of sides, facing each other, of a periphery of the second main surface of the silicon carbide substrate. The ohmic electrode layer and the metal electrode layer are disposed in a region ranging from a position on the second main surface to a surface of the notch. A cross-section of the notch orthogonal to each of the sides has a corner. In the cross-section, a thickness of the silicon carbide substrate at an edge thereof under which the notch is formed is smaller than a thickness of the silicon carbide substrate in a region under which the notch is not formed, and larger than a thickness of the silicon carbide substrate in a region under which a bottom of the corner is formed.

According to this aspect, the notch whose cross-section has a corner is formed in the periphery of the second main surface of the silicon carbide substrate. Therefore, even if the metal electrode layer is delaminated from the edge surface of the semiconductor element, a force vector in the delamination direction in the corner of the notch runs in a different direction, thereby being able to reduce the delamination.

In a second aspect, in the semiconductor element of the first aspect, the corner in the notch forms an angle of less than 90 degrees.

According to this aspect, the delamination of the metal electrode layer can be more efficiently reduced.

In a third aspect, in the semiconductor element of the first aspect, the notch is formed in a whole of the periphery of the second main surface of the silicon carbide substrate.

According to this aspect, the delamination of the metal electrode layer can be reduced in the whole of the periphery of the second main surface.

In a fourth aspect, in the semiconductor element of the third aspect, a width of the notch in a cross-section passing through a diagonal line on the second main surface of the silicon carbide substrate is larger than a width of the notch in a cross-section passing through a line connecting middle points of the one pair of the sides, facing each other, of the second main surface of the silicon carbide substrate together.

According to this aspect, the notch is disposed so as to have a larger width in a region on the diagonal line on the back surface of the semiconductor element where a larger stress is applied, and therefore, the delamination of the metal electrode layer can advantageously be reduced.

In a fifth aspect, in the semiconductor element of the third aspect, a groove is further disposed in the second main surface of the silicon carbide substrate.

According to this aspect, even if the metal electrode layer is delaminated from the edge surface at the interface between the metal electrode layer and the ohmic electrode layer, a direction of a force vector in the delamination direction is changed in a corner of the groove in addition to the corner of the notch, and the delamination can further be reduced.

In a sixth aspect, in the semiconductor element of the fifth aspect, the groove is disposed in the second main surface of the silicon carbide substrate so as to connect parts of the notch disposed along adjoining sides of the second main surface together.

According to this aspect, even if foam occurs when the semiconductor element is mounted with solder, the foam can be removed through the groove.

In a seventh aspect, a method of manufacturing a semiconductor element includes preparing a silicon carbide substrate having a first main surface on which a silicon carbide layer is formed, forming, on the silicon carbide layer, a circuit element layer in which a scribe line is formed, forming a recess in a second main surface of the silicon carbide substrate by anisotropy etching, the recess being disposed in a position corresponding to the scribe line and extending in a same direction as the scribe line, forming an ohmic electrode layer on the second main surface in which the recess is formed, forming a metal electrode layer on the ohmic electrode layer, and dicing the silicon carbide substrate along the scribe line to form the semiconductor element. The recess is formed such that a bottom surface thereof and each of both side surfaces thereof form a corner, and a sub-trench is formed in the recess as the corner.

According to this aspect, the semiconductor element of the first aspect can easily be manufactured.

In an eighth aspect, in the dicing of the manufacturing method of the seventh aspect, a blade is entered from the second main surface to perform the dicing.

According to this aspect, a large area of the element on the first main surface can be obtained, and the number of the chips obtained can be increased.

In a ninth aspect, a semiconductor module includes the semiconductor element of any one of the first to the sixth aspects, a module substrate having a surface on which an interconnect layer is disposed, and a conductive connecting layer disposed on at least a part of the interconnect layer, wherein the conductive connecting layer connects the interconnect layer to the metal electrode layer over the second main surface of the semiconductor element.

According to this aspect, the semiconductor module with high reliability is achieved.

In a tenth aspect, in the semiconductor module of the ninth aspect, a thickness of the conductive connecting layer in a region under the notch is larger than a thickness of the conductive connecting layer in a region under a middle portion of the second main surface of the semiconductor element.

According to this aspect, the reliability of the semiconductor module is further improved.

In an eleventh aspect, a method of manufacturing a semiconductor module includes preparing the semiconductor element of any one of the first to the sixth aspects, preparing a module substrate having an interconnect layer, forming a conductive connecting layer on the interconnect layer of the module substrate, and connecting the metal electrode layer over the second main surface of the semiconductor element to the interconnect layer of the module substrate through the conductive connecting layer.

According to this aspect, the semiconductor module of the ninth aspect can easily be manufactured.

In a twelfth aspect, a semiconductor package includes the semiconductor element of any one of the first to the sixth aspects, a lead frame, and a conductive connecting layer disposed on at least a part of the lead frame, wherein the conductive connecting layer connects the lead frame to the metal electrode layer over the second main surface of the semiconductor element.

According to this aspect, the semiconductor package with high reliability is achieved.

In a thirteenth aspect, in the semiconductor package of the twelfth aspect, a thickness of the conductive connecting layer in a region under the notch is larger than a thickness of the conductive connecting layer in a region under a middle portion of the second main surface of the semiconductor element.

According to this aspect, the reliability of the semiconductor package is further improved.

Combinations of the above described elements as appropriate can also be included in the scope of the invention for which patent protection is sought in the present patent application.

An example embodiment of the present disclosure will be described herein with reference to the accompanying drawings. In all the drawings, similar elements are indicated by the same reference character and a description thereof will be omitted as appropriate.

FIG. 1 is a cross-sectional view schematically illustrating a configuration of a semiconductor element in the example embodiment of the present disclosure. The semiconductor element 10 in FIG. 1 includes a silicon carbide (SiC) substrate 11. The silicon carbide substrate 11 includes a main surface inclined from, for example, the 4H—SiC (0001) plane by $\theta$ degrees ($0 \leq \theta \leq 10$ degrees), and the front surface of the substrate (a first main surface) is the Si plane, and the back surface (a second main surface) is the C plane. On the front surface of the silicon carbide substrate 11, an epitaxial layer 12 which is, e.g., an epitaxially grown, n-type 4H—SiC layer is formed as a silicon carbide layer. A circuit element layer 13 is formed on the epitaxial layer 12 using a semiconductor process. A circuit is formed in the circuit element layer 13, and includes a source electrode and a gate electrode.

An ohmic electrode layer 14 is formed on the back surface of the silicon carbide substrate 11. The ohmic electrode layer 14 includes, for example, titanium, and is silicided at a side contacting the silicon carbide substrate 11. The ohmic electrode layer 14 has a thickness of, e.g., about 150 nm. A metal electrode layer 15 is formed on the ohmic electrode layer 14. Although the metal electrode layer 15 is illustrated as a single layer in FIG. 1, it may be made of a single layer or a stacked layer. For example, a stacked electrode of Ti/Ni/Ag can be selected as a possible metal electrode layer 15. In this case, the layer has a structure in which the Ti side contacts the ohmic electrode layer 14. The metal electrode layer 15 is disposed in die-bonding (bonding with solder, a conductive adhesive, metal diffusion bonding, etc.) to an interconnect layer of a semiconductor module or a lead frame such as TO-220.

A notch 20 is formed in the back surface of the silicon carbide substrate 11 along a side of the periphery of a chip surface. The cross-section of the notch 20 orthogonal to a side of the chip surface has a corner 21. As illustrated in FIG. 1, the thickness X of the silicon carbide substrate 11 at an edge under which the notch 20 is smaller than the thickness Z of the silicon carbide substrate 11 under which the notch 20 is not formed, and larger than the thickness Y of the silicon carbide substrate 11 under which the bottom of the corner 21 is formed. The corner 21 forms an acute angle of less than 90 degrees. The ohmic electrode layer 14 and the metal electrode layer 15 are disposed in a region ranging from a position on the back surface of the silicon carbide substrate 11 to the surface of the notch 20.

Figure 2:
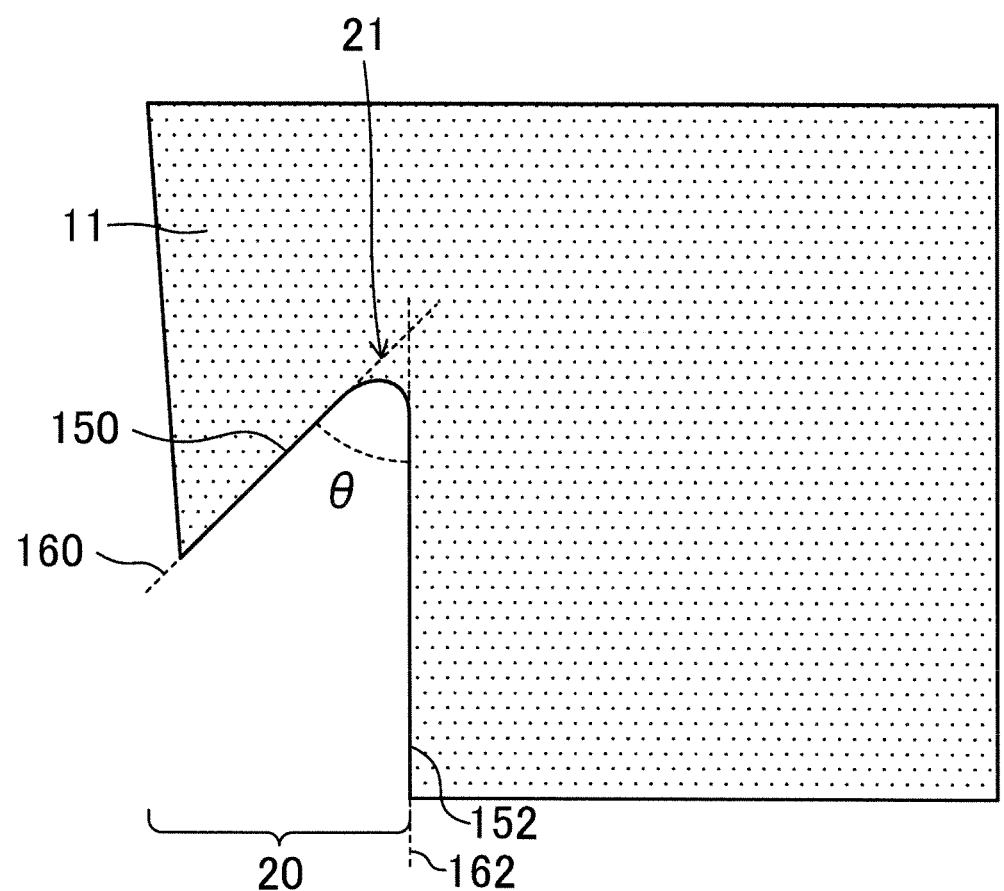
FIG. 2 is an enlarged, cross-sectional view schematically illustrating a configuration of a notch of the semiconductor element in the example embodiment of the present disclosure.

FIG. 2 is an enlarged, cross-sectional view schematically illustrating a configuration of the notch 21 of the semiconductor element in the example embodiment of the present disclosure. As illustrated in FIG. 2, the corner 21 may have a rounded shape. In this case, the angle of the corner 21 is defined by an angle $\theta$ formed between a tangent line 160 of a bottom surface 150 of the notch 20 adjacent to the corner 21 and a tangent line 162 of a side surface 152 of the notch 20 adjacent to the corner 21.

In this way, the back surface of the semiconductor element 10 of the embodiment has the notch 20, with the corner 21 in the cross-section thereof, along sides of the periphery of the back surface. Therefore, even if the metal electrode layer 15 is delaminated from the edge surface of the semiconductor element 10, the progress of the delamination is stopped since a direction of a force vector in the delamination direction is changed in the corner 21 of the notch 20. Therefore, this can reduce occurrence of the delamination of the metal electrode layer 15 in the entire back surface of the semiconductor element 10.

A method of manufacturing the semiconductor element 10 will be described below with reference to FIGS. 3-6.

Figure 3A:
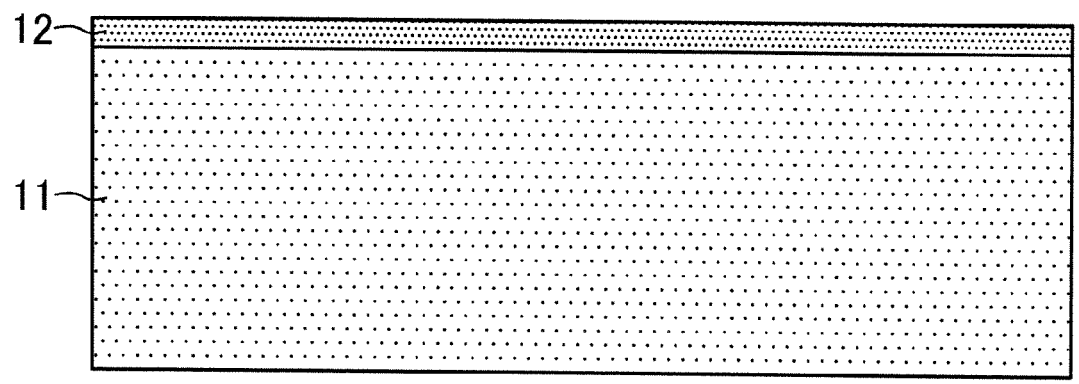
FIGS. 3A and 3B are cross-sectional views illustrating a process of forming the semiconductor element in the example embodiment of the present disclosure.
Figure 3B:
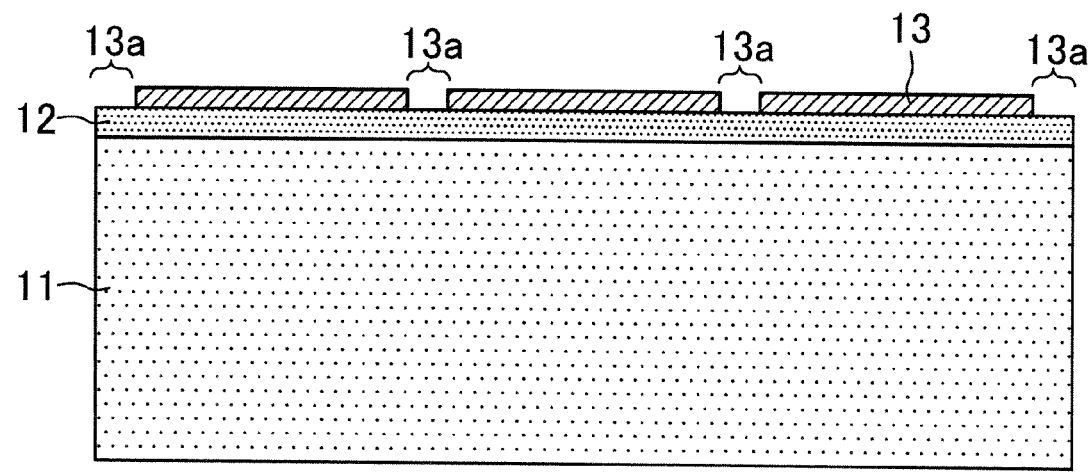

As illustrated in FIG. 3A, the silicon carbide substrate 11 is prepared first. The silicon carbide substrate 11 has the front surface (the first main surface) on which the epitaxial layer 12 serving as a silicon carbide layer is formed. At that time, a buffer-layer (an n+-type semiconductor layer, here, a silicon carbide layer) having a thickness of approximately 0.5 to 4 µm (at concentration of approximately $1 \times 10^{16}$ to $1 \times 10^{19}$ cm$^{-3}$) may be formed at the interface thereof. Subsequently, as illustrated in FIG. 3B, the circuit element layer 13 is formed on the epitaxial layer 12 using a semiconductor formation process. A scribe line 13a is formed so as to separate the circuit element layer 13. Here, a detailed explanation thereof will be omitted.

Figure 4A:
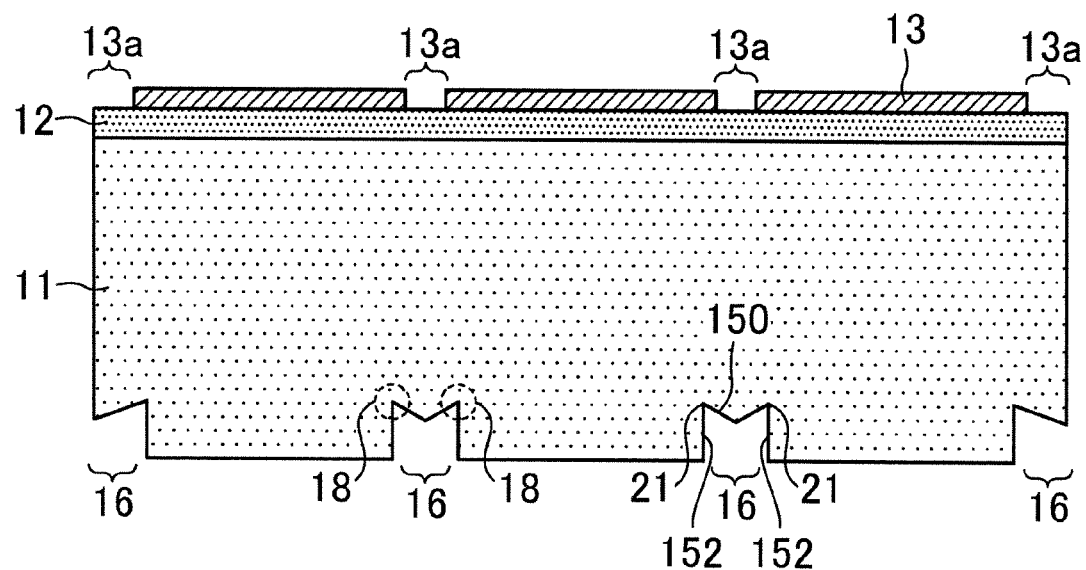
FIGS. 4A and 4B are cross-sectional views illustrating a process of forming the semiconductor element in the example embodiment of the present disclosure.

Subsequently, as illustrated in FIG. 4A, a recess (groove) 16 having a rectangular cross-section is formed in a position in the back surface (the second main surface) of the silicon carbide substrate 11. The position corresponds to the scribe line 13a in the front surface. The recess 16 has a sub-trench 18. In the present disclosure, the sub-trench refers to a portion formed by further digging the corner of the recess from a trench that is a main portion of the recess. The recess 16 extends in the same direction as the scribe line 13a, and is formed such that the bottom surface 150 and each of the two side surfaces 152 form the corner 21. The recess 16 has a depth of 50 µm and a width of 150 µm, for example.

Figure 7:
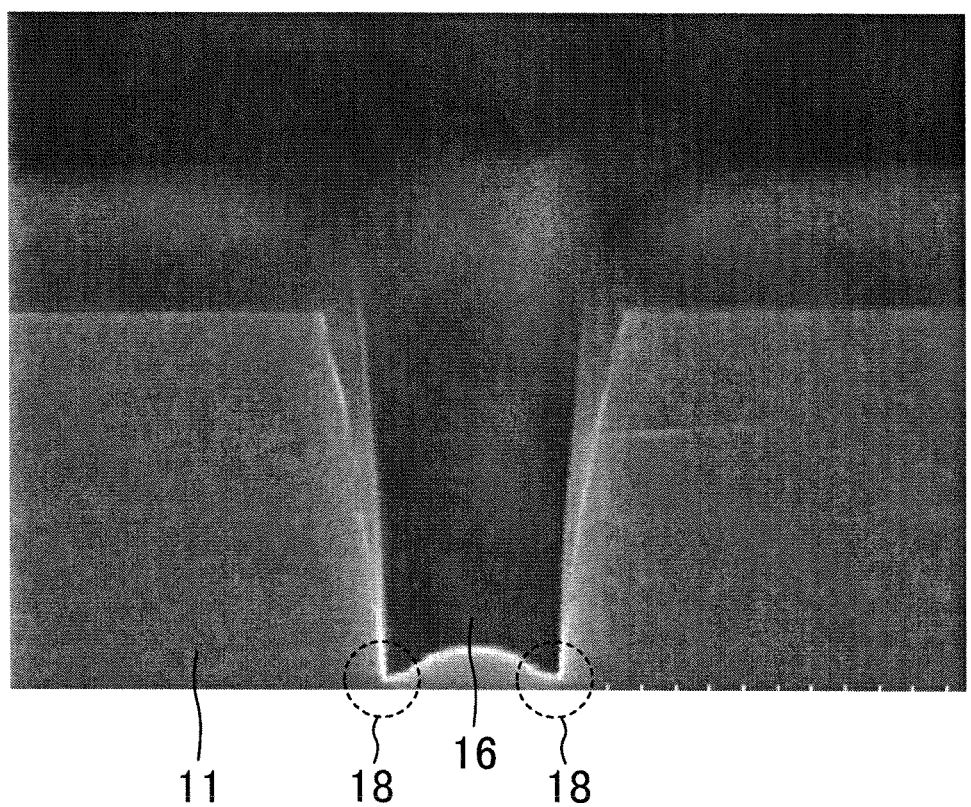
FIG. 7 is an electron-microscope photograph of a cross-section of a recess having a sub-trench.

The method of forming the recess 16 will be specifically described as follows, for example. An SiO$_2$ layer is formed on each of the back and front surfaces of a wafer by using a plasma CVD apparatus, and then, a resist is applied on the SiO$_2$ layer on the back surface. Marks for alignment on the front surface are transmitted with a microscope from the back surface to allow alignment, and a resist pattern is formed by exposure and development so as to correspond to the scribe line 13a on the front surface of the silicon carbide substrate 11. The SiO$_2$ layer is dry-etched to be patterned using the resist mask. By using the SiO$_2$ layer formed as described above as a mask, the back surface of the silicon carbide substrate 11 is dry-etched to form the recess 16. For example, the dry etching is performed using a mixture of Cl$_2$ gas and O$_2$ gas at a ratio of 2:1 to form the groove with the sub-trench 18. Changing the mixture ratio of the gases makes it possible to control the shape of the sub-trench 18. FIG. 7 is a photograph illustrating an actual cross-section of the recess having the sub-trench. In FIG. 7, the sub-trench 18 is formed in the recess 16, and is to serve as the corner 21 of the notch 20 after the dicing process.

Figure 4B:
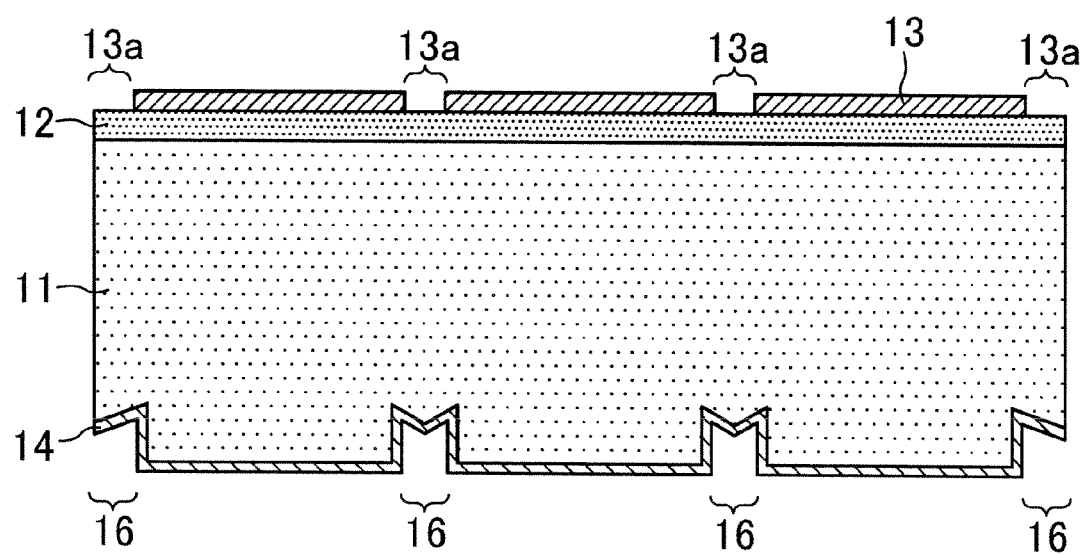

Subsequently, the ohmic electrode layer 14 including titanium is stacked on the back surface of the silicon carbide substrate 11, and heat treatment is performed at a temperature of 800 to 1100° C. under nitrogen atmosphere. This forms the ohmic electrode layer 14 whose surface is nitrided, as illustrated in FIG. 4B. The ohmic electrode layer 14 is formed on the recess 16. At that time, a silicide reaction occurs on the interface between the silicon carbide substrate 11 and the titanium, and Ti-silicide is formed on at least the interface. Since the heat treatment is performed under nitrogen atmosphere, TiN is formed in the outermost layer of the back surface. For example, as viewed from the back surface, a structure of Ti/SiC is seen before the heat treatment and a structure of TiN/Ti/Ti-silicide/SiC is seen after the heat treatment. The thickness of an unreacted layer between TiN and Ti-silicide varies depending on the film thickness, the temperature of the heat treatment, and time, and a structure of TiN/Ti-silicide/SiC may be seen.

Then, for example, aluminum is stacked on the front surface including the circuit element layer 13 as metal serving as an upper interconnect, and is patterned to form a source electrode and a gate electrode. The illustration of the process is omitted in FIGS. 5(a) and 5(b) described later. If the upper interconnect is made of aluminum, and its patterning is performed by wet-etching using a phosphoric acid-based material, the ohmic electrode layer 14 on the back surface is not almost etched since the nitrided TiN is formed on the surface thereof. If the patterning is performed by dry etching, it is preferable to form metal such as Cu, Au, Pt on the ohmic electrode layer 14 to prevent corrosion of the ohmic electrode layer 14.

Figure 5A:
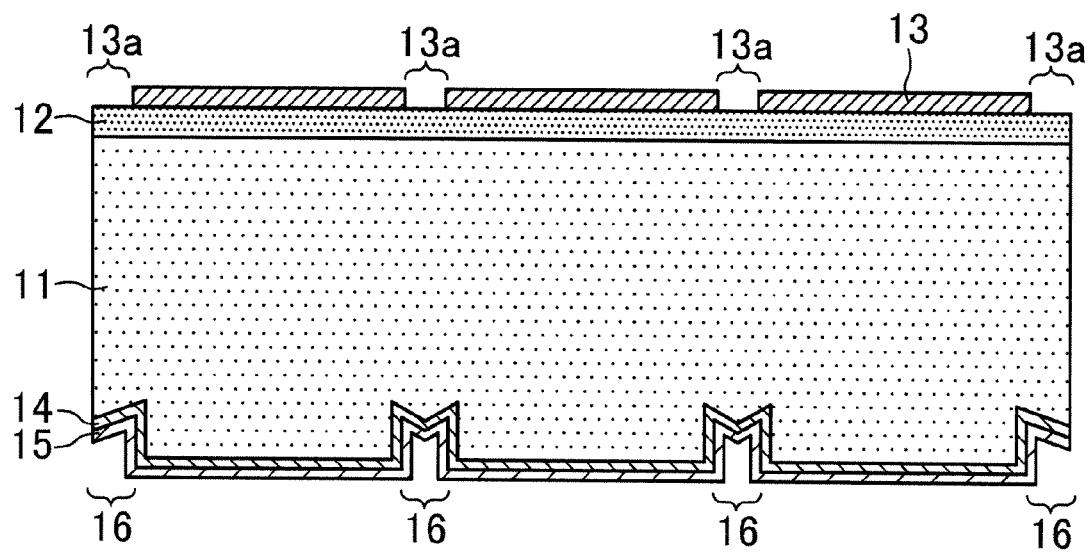
FIGS. 5A and 5B are cross-sectional views illustrating a process of forming the semiconductor element in the example embodiment of the present disclosure.

Subsequently, as illustrated in FIG. 5A, the metal electrode layer 15 is formed on the ohmic electrode layer 14. The metal electrode layer 15 is also formed in the recess 16 as well as the ohmic electrode layer 14. Examples of the metal electrode layer 15 include a Ti layer, a Ni layer, and an Ag layer. The layer structure of the metal electrode layer 15 is selected as appropriate depending on the packaging condition of the semiconductor element 10. Other examples may include a Ti/Ni/Au layer, a Cr/NiCr/Ni/Ag layer, and combination of other materials.

Figure 5B:
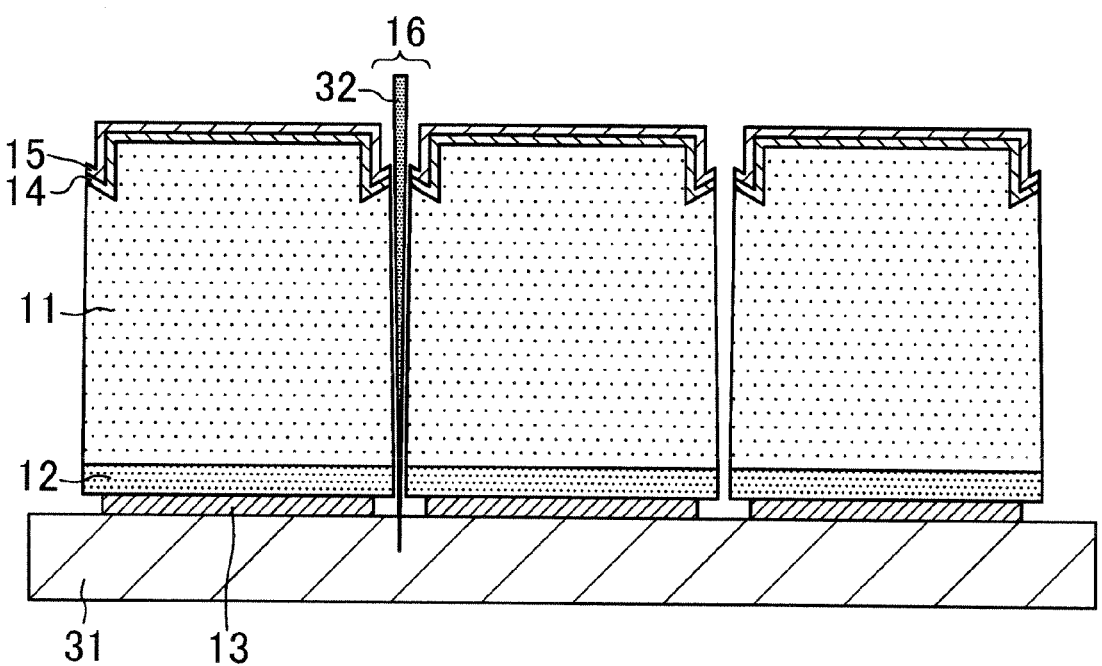
Figure 6:
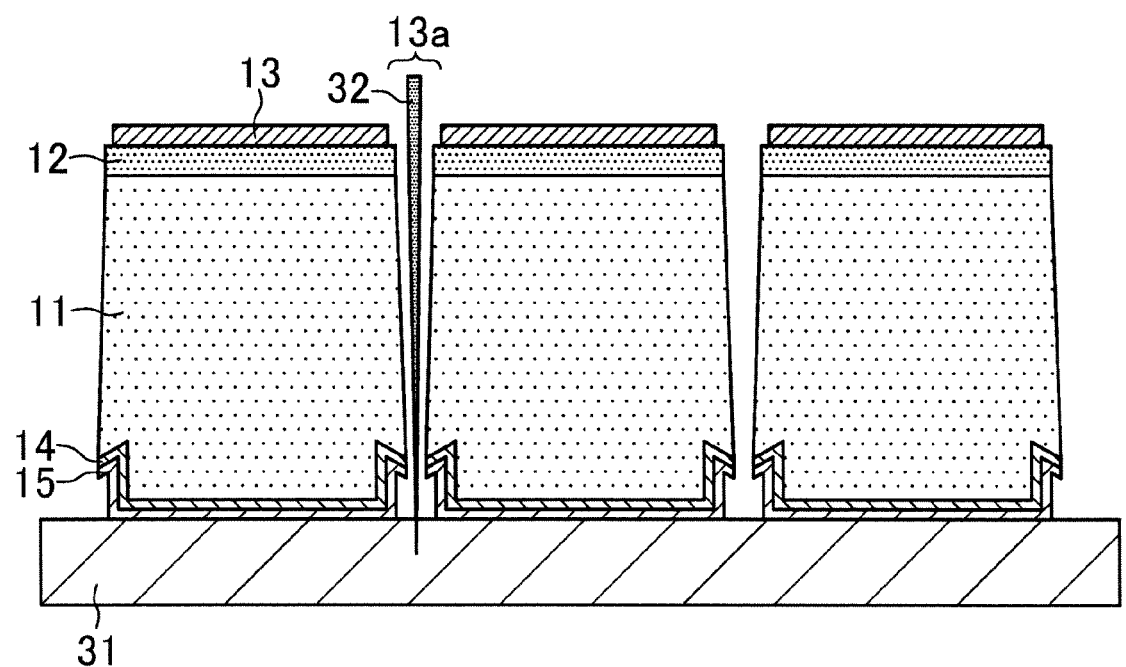
FIG. 6 is a cross-sectional view illustrating another example of a dicing process of the semiconductor element in the example embodiment of the present disclosure.

Finally, the silicon carbide substrate 11 is diced along the scribe line 13a to form the semiconductor element 10. In the example of FIG. 5B, a dicing film 31 is adhered to the side of the circuit element layer 13, and a blade 32 is entered with a dicer from the back surface to dice the silicon carbide substrate 11. In other words, the blade 32 is entered from the recess 16. As illustrated in FIG. 6, the blade 32 may be entered from the front surface of the silicon carbide substrate 11 to dice the silicon carbide substrate 11. In this case, the blade 32 is entered from the scribe line 13a.

The blade 32 has a tapered shape that narrows toward the tip. Therefore, as illustrated in FIG. 5B, when the blade 32 is entered from the back surface of the silicon carbide substrate 11, the edge surface of the semiconductor element 10 is reverse-beveled, and chipping on the front surface is reduced. Here, "reverse-beveled" means that the edge surface of the semiconductor element 10 has an inclined shape such that the width of the semiconductor element 10 narrows from the front surface (the first main surface) on which the circuit element layer 13 is disposed toward the back surface (the second main surface). Therefore, the scribe line 13a on the front surface of the silicon carbide substrate 11 can be narrow. As a result, this can advantageously obtain a large area of the element on the front surface and increase the number of the chips obtained.

As described above, according to the embodiment, the notch 20 whose cross-section has the corner 21 is formed in the periphery of the back surface of the semiconductor element 10. Therefore, even if the metal electrode layer 15 is delaminated from the element edge surface at the interface between the metal electrode layer 15 and the ohmic electrode layer 14 due to a thermal stress by the heat generated during the manufacturing process such as the dicing process or during the operation of the element, a direction of a force vector in the delamination direction is changed in the corner 21 of the notch 20, and the delamination can be stopped. Therefore, this can reduce occurrence of the delamination of the metal electrode layer 15 in the entire surface.

Figure 8A:
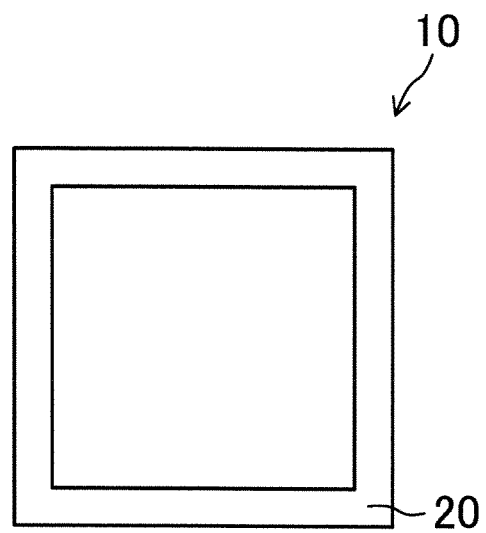
FIGS. 8A and 8B are views illustrating examples of arrangement of a notch.
Figure 8B:
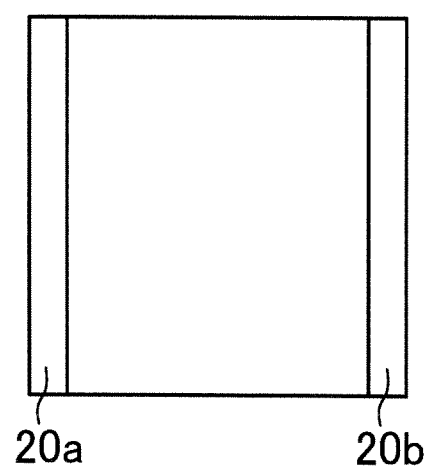

In the embodiment, as illustrated in FIG. 8A, the notch 20 is formed in the entire periphery of the chip surface in the back surface of the silicon carbide substrate 11 of the semiconductor element 10. However, the embodiment is not limited to this configuration. Alternately, for example, as illustrated in FIG. 8B, notches 20a and 20b may be formed along one pair of the sides facing each other and no notch may be formed along the other pair of the sides. For example, in some cases, in the process of dicing the semiconductor element, the dicing method may differ between the directions such that the dicing process is used in one direction while a cleavage process is used in the other direction. No notch is formed in a direction where the delamination of the metal electrode layer 15 is less likely to occur like the cleavage process. This can make the manufacturing process easier.

In the embodiment, as illustrated in FIG. 8A, the notch 20 having a constant width is disposed in the entire periphery of the chip surface in the back surface of the silicon carbide substrate 11 of the semiconductor element 10. However, the embodiment is not limited to this configuration.

Figure 9A:
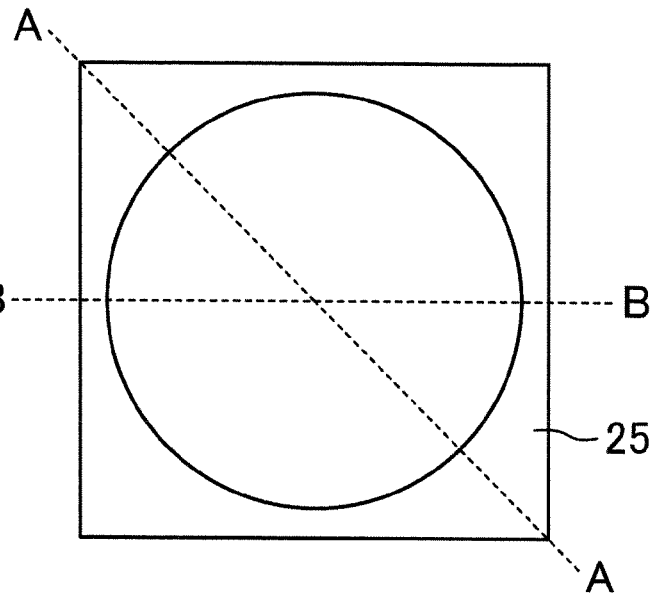
FIGS. 9A, 9B, and 9C are views schematically illustrating a configuration of a modified example of the semiconductor element in the example embodiment of the present disclosure.
Figure 9B:
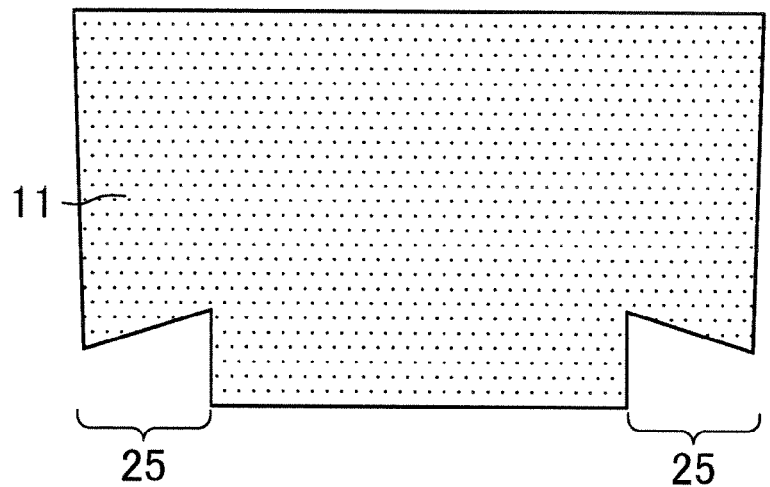
Figure 9C:
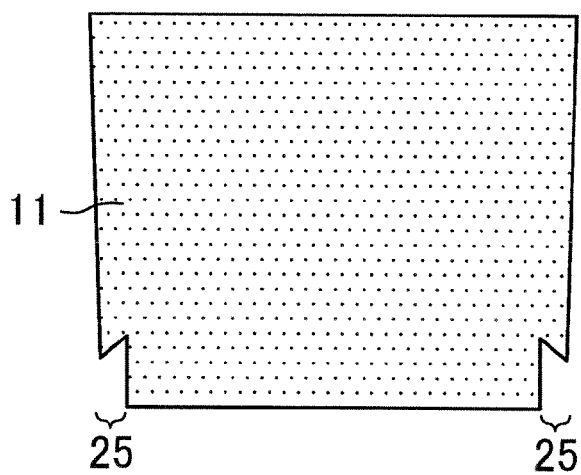

FIG. 9A is a plan view schematically illustrating a configuration of a modified example of the semiconductor element in the embodiment. FIG. 9B is a cross-sectional view of the semiconductor element taken along the line A-A illustrated in FIG. 9A, and FIG. 9C is a cross-sectional view of the semiconductor element taken along the line B-B illustrated in FIG. 9A. The line A-A corresponds to a diagonal line on the back surface of the silicon carbide substrate 11, and the line B-B corresponds to a line connecting middle points of one pair of the sides, facing each other, of the back surface of the silicon carbide substrate 11. In FIGS. 9A-9C, the elements other than the silicon carbide substrate 11 in the semiconductor element are omitted.

As illustrated in FIGS. 9B and 9C, the width of the notch 25 in the line A-A is larger than that in the line B-B. Thus, the notch 25 may be disposed such that the width of the notch 25 in the cross-section passing through the diagonal line on the back surface of the silicon carbide substrate 11 is larger than that in the cross-section passing through the line connecting middle points of the one pair of the sides, facing each other, of the back surface of the silicon carbide substrate 11 together. With such a configuration, the notch 25 is disposed so as to have a larger width on the diagonal line, to which a larger stress is applied, on the back surface of the semiconductor element, and therefore, the delamination of the metal electrode layer can advantageously be reduced. When the semiconductor element is mounted with a conductive material such as solder, the configuration can increase a region of the solder having a large thickness, leading to improvement of reliability in the mounting.

Figure 10A:
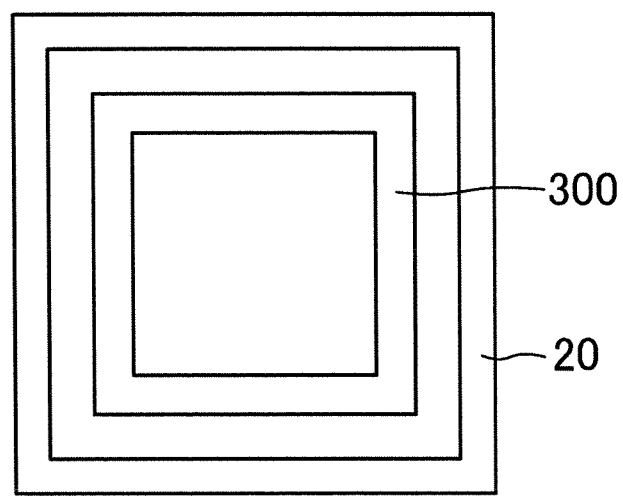
FIGS. 10A and 10B are views schematically illustrating a configuration of another modified example of the semiconductor element in the example embodiment of the present disclosure.
Figure 10B:
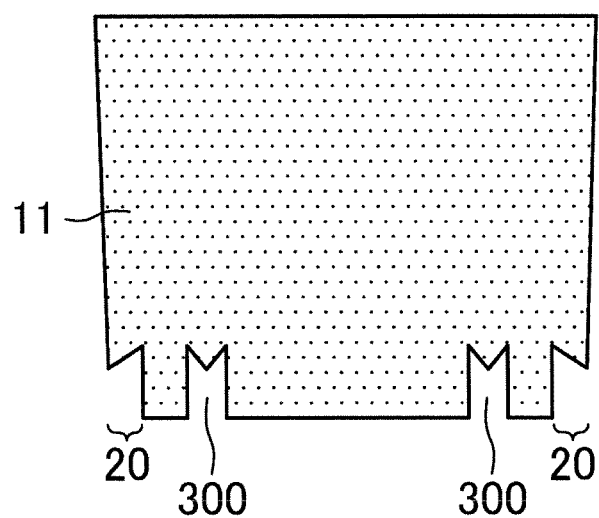
Figure 11A:
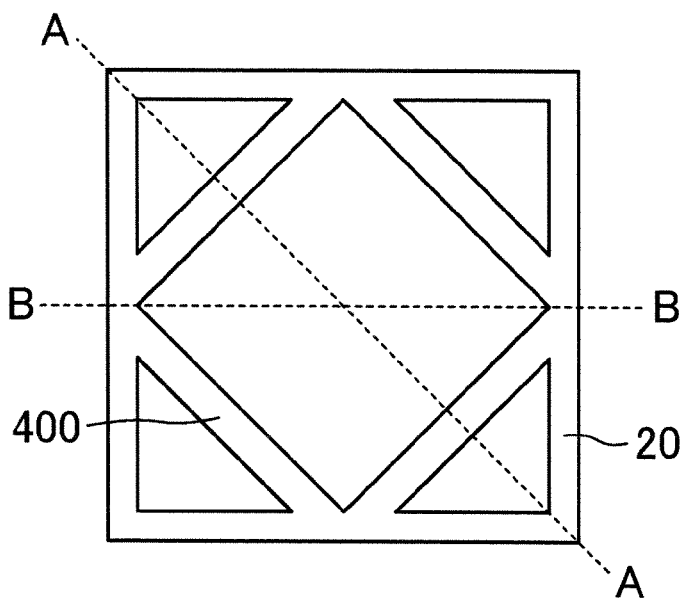
FIGS. 11A, 11B and 11C are views schematically illustrating a configuration of a still another modified example in the semiconductor element in the example embodiment of the present disclosure.
Figure 11B:
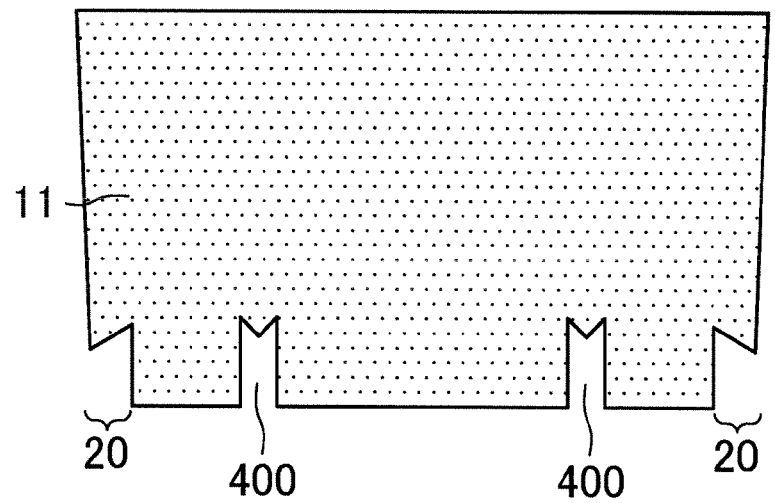
Figure 11C:
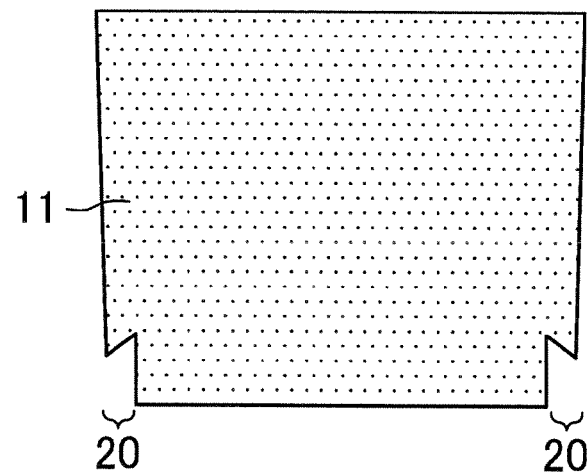

A groove may be disposed inside the notch in the back surface of the silicon carbide substrate of the semiconductor element. FIG. 10A is a plan view schematically illustrating a configuration of another modified example of the semiconductor element in the embodiment, and FIG. 10B is a cross-sectional view of the semiconductor element. FIG. 11A is a plan view schematically illustrating a configuration of a still another modified example of the semiconductor element in the embodiment, FIG. 11B is a cross-sectional view of the semiconductor element taken along the line A-A, and FIG. 11C is a cross-sectional view of the semiconductor element taken along the line B-B. The line A-A corresponds to a diagonal line on the back surface of the silicon carbide substrate 11, and the line B-B corresponds to a line connecting middle points of one pair of the sides, facing each other, of the back surface of the silicon carbide substrate 11 together. In FIGS. 10A-11C, the elements other than the silicon carbide substrate 11 in the semiconductor element are omitted.

In the example illustrated in FIGS. 10A-10C, one groove 300 is disposed in the back surface of the semiconductor element along the inner periphery of the notch 20 with an interval between the notch 20 and the groove 300. In the example illustrated in FIGS. 11A-11C, four grooves 400 are disposed in the back surface of the semiconductor element so as to connect parts of the notch 20 disposed along the adjoining sides together, and be orthogonal to the diagonal line on the back surface of the semiconductor element. In the examples illustrated in FIGS. 10A-11C, even if the metal electrode layer is delaminated from the edge surface of the element at the interface between the metal electrode layer and the ohmic electrode layer, a direction of a force vector in the delamination direction is changed in corners of the grooves 300 and 400 in addition to the corner of the notch, and the delamination can be further reduced. In the example illustrated in FIGS. 11A-11C, the grooves 400 are disposed in the back surface of the semiconductor element so as to connect parts of the notch 20 disposed along the adjoining sides together, and therefore, even if air bubbles occur when the semiconductor element is mounted with solder, the air bubbles can be removed through the grooves 400.

In the examples illustrated in FIGS. 10A-11C, each of the grooves 300 and 400 has a sub-trench in the bottom thereof, but the embodiment is not limited to this configuration. Alternately, no sub-trench is disposed in the bottom of the groove, and the bottom of the groove may be flat.

(Example of Semiconductor Module)

Figure 12:
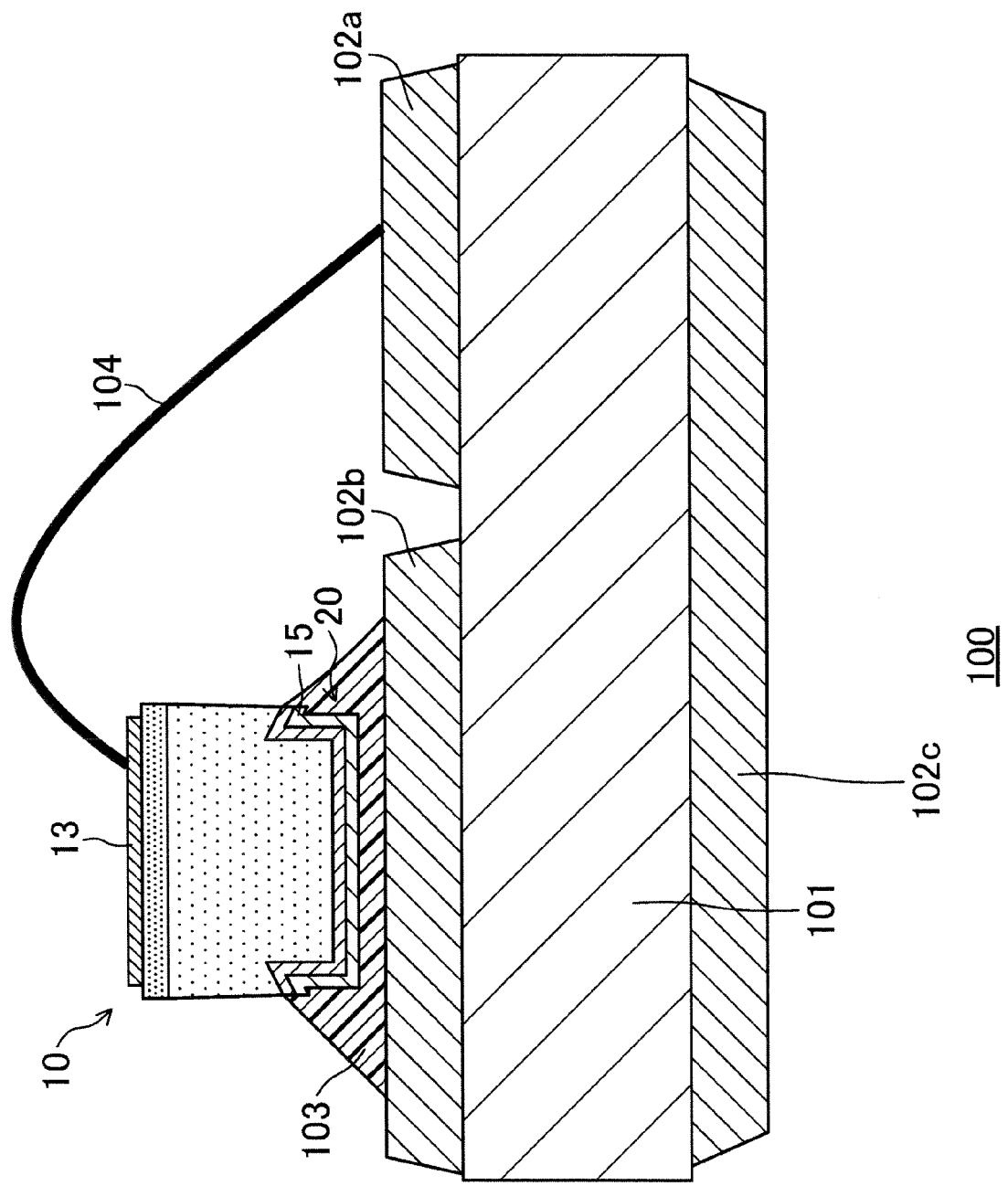
FIG. 12 is a cross-sectional view schematically illustrating a semiconductor module using the semiconductor element in the example embodiment of the present disclosure.

FIG. 12 is a cross-sectional view schematic illustrating a semiconductor module using the semiconductor element in the above-described embodiment. FIG. 12 schematically illustrates the semiconductor element 10 and the periphery thereof, and illustration of an encapsulant resin layer, a case, etc., formed in a typical semiconductor module is omitted.

The semiconductor module 100 in FIG. 12 includes the semiconductor element 10 shown in the example embodiment of the present disclosure, and a module substrate 101 having a surface on which interconnect layers 102a, 102b and 102c are formed. The interconnect layer 102a is a pattern for wire bonding, the interconnect layer 102b is an element mounting portion, and the interconnect layer 102c is an interconnect layer for connecting the module substrate 101 to the base substrate (not shown). A conductive connecting layer 103 including, e.g., solder or a conductive adhesive is disposed on the interconnect layer 102b, and the conductive connecting layer 103 connects the interconnect layer 102b to the metal electrode layer 15 over the back surface of the semiconductor element 10. The conductive connecting layer 103 is disposed under the notch 20, and therefore, the thickness of the conductive connecting layer 103 in a region under the notch 20 is larger than that in a region under the middle portion of the back surface of the semiconductor element 10. A wire 104 connects the interconnect layer 102a to an electrode (not shown) disposed on the circuit element layer 13 on the front surface of the semiconductor element 10.

The configuration of FIG. 12, as well as in the above-described embodiment, reduces delamination of the metal electrode layer 15 from the back surface of the semiconductor element 10. The conductive connecting layer 103 has a larger thickness in the region under the notch 20, thereby improving reliability of the semiconductor module 100. That is because the conductive connecting layer 103 can have a larger thickness in the region under the outer peripheral portion of the chip where the thermal stress is largest to make it possible to reduce occurrence of a crack in the conductive connecting layer 103 due to the thermal stress during the operation.

A method of manufacturing the semiconductor module 100 will be described below with reference to FIGS. 13A-14B.

Figure 13A:
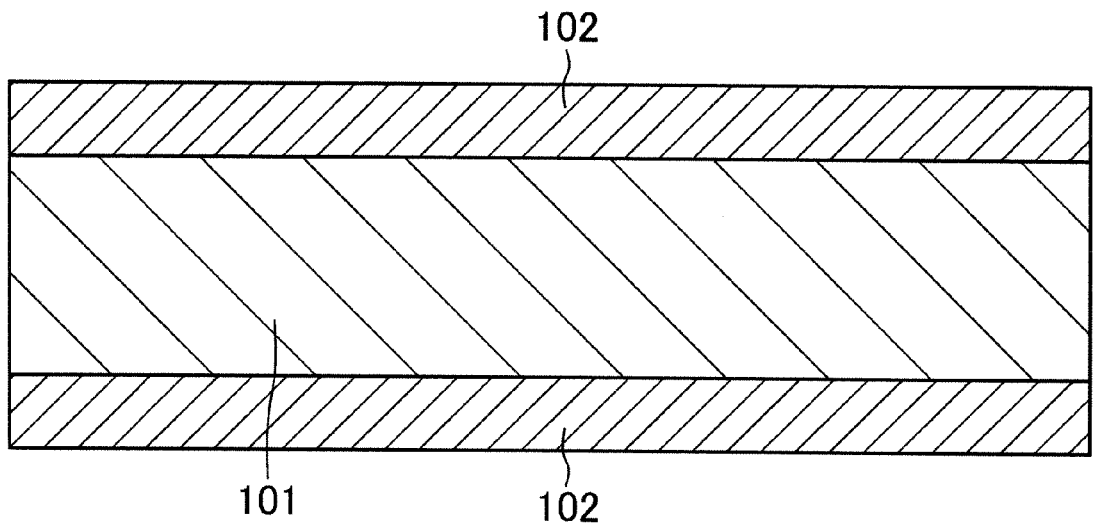
FIGS. 13A and 13B are cross-sectional views illustrating a process of forming the semiconductor module.

First, for example, a copper foil 102 is adhered to both surfaces of the insulative module substrate 101, as illustrated in FIG. 13A. An example of the method of adhering the copper foil 102 to the module substrate 101 includes a direct bonding method in which a substrate and a copper plate are directly bonded to each other. A ceramic, such as alumina, aluminum nitride, silicon nitride, is selected as a material of the module substrate 101. The module substrate 101 has a thickness of 0.5 mm, for example. Various kinds of materials are selected as the material of the module substrate 101 depending on the heat resistance of the module, a predetermined set value of a breakdown voltage of the module, etc. A pure copper foil is used as a material of the copper foil 102, and has a thickness of 0.2 mm, for example. The thickness of the copper foil 102 is determined by a predetermined set value of current flowing in the semiconductor element 10, and the greater the amount of the current flows, the larger the thickness is.

Figure 13B:
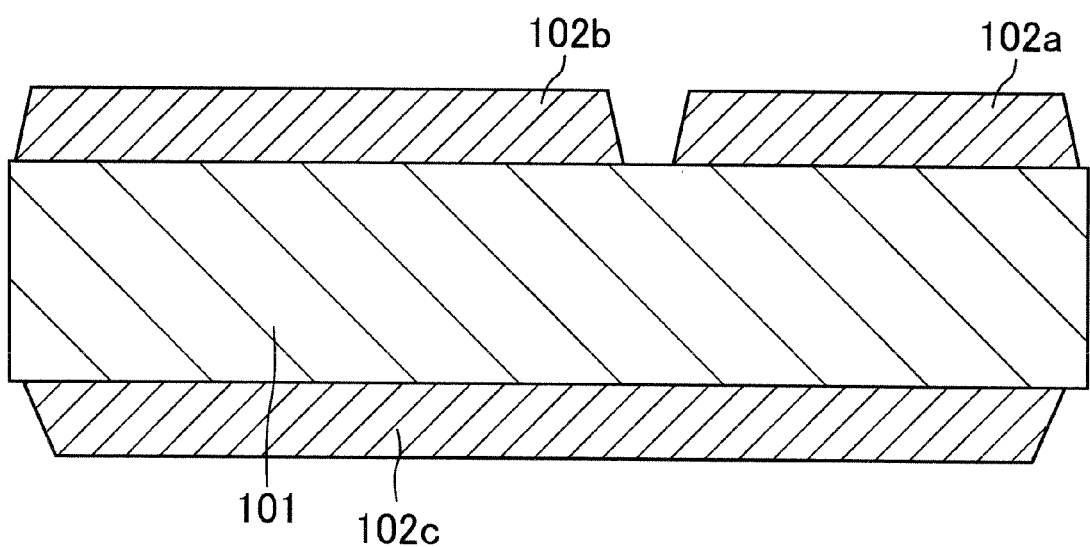

Subsequently, as illustrated in FIG. 13B, a predetermined region is selectively removed using a well-known photolithography method and etching method to form the interconnect layer 102b serving as an element mounting portion, a circuit (not shown), the interconnect layer 102a serving as a pattern for wire bonding, and the interconnect layer 102c serving as an interconnect layer for being connected to the base substrate. Ni plating or Ni/Au plating may be performed on the copper interconnect by plating after the patterning process, though it is not illustrated in FIG. 13B. The formation of the plating film can reduce formation an oxide film on the copper surface, and improve bonding reliability of solder bonding.

Figure 14A:
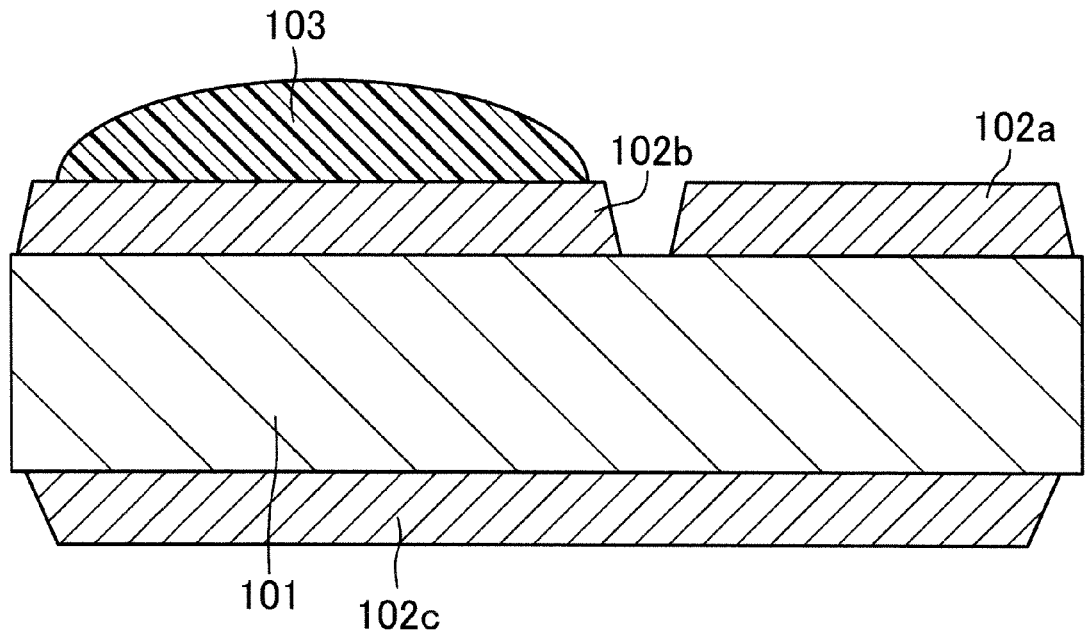
FIGS. 14A and 14B are cross-sectional views illustrating a process of forming the semiconductor module.

Subsequently, as illustrated in FIG. 14A, the conductive connecting layer 103 such as solder is applied and reflowed to form a solder bump. Solder having a high melting point is selected as the solder for bonding used here so as not to melt to move the semiconductor element 10 even if a heat treatment is performed when the interconnect layer 102c disposed on the back surface of the module substrate is bonded to the base substrate (not shown here). For example, a solder material, such as Au—Ge solder or Au—Sn solder, having a high melting point is selected. If a conductive adhesive, etc., is selected as a material of the conductive connecting layer 103, reflow is not performed after the application, and a process of mounting the semiconductor element illustrated in FIG. 14B is performed after the application.

Figure 14B:
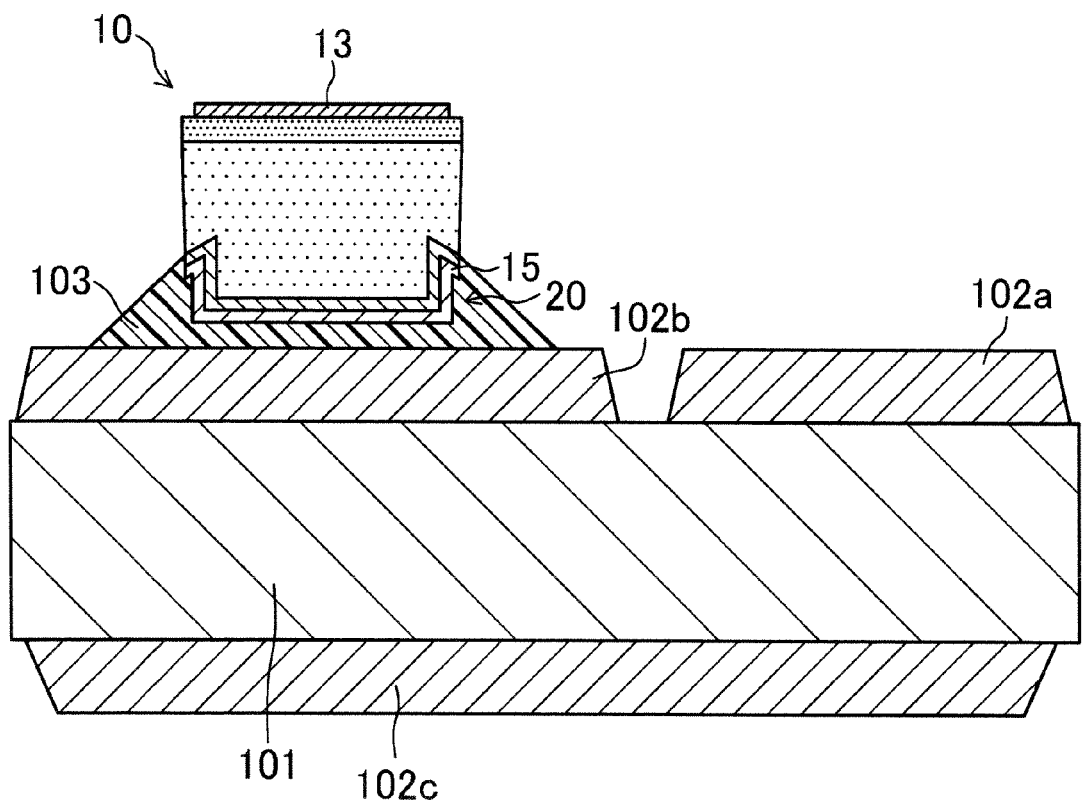

Subsequently, as illustrated in FIG. 14B, the semiconductor element 10 is mounted on the conductive connecting layer 103 and reflow is performed to perform a bonding. At that time, solder is fluid, and enters a region under the notch 20 formed in the periphery of the back surface of the semiconductor element 10. This increases the thickness of the conductive connecting layer 103 in the region under the periphery of the back surface of the semiconductor element 10.

Finally, the wire 104 is formed from the front surface of the semiconductor element 10 toward the interconnect layer 102a on the module substrate 101 by wire-bonding. This completes the formation of the semiconductor module 100 as illustrated in FIG. 12.

The semiconductor module described above can advantageously not only stop the progress of the delamination of the metal electrode layer 15 as described in the example embodiment of the present disclosure, but also improve reliability of the semiconductor module because of the conductive connecting layer 103 having a larger thickness in the region formed under the notch 20 formed in the periphery of the back surface of the semiconductor element 10.

(Example of Semiconductor Package)

Figure 15:
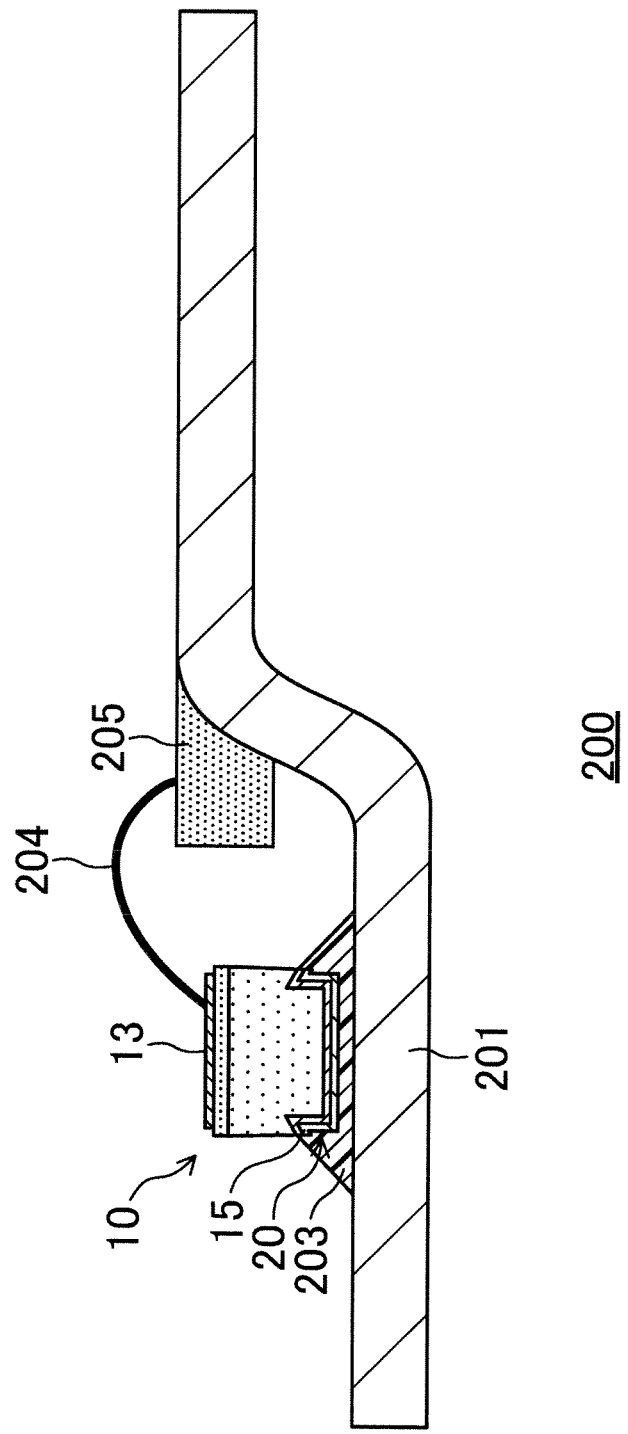
FIG. 15 is a cross-sectional view schematically illustrating a semiconductor package using the semiconductor element in the example embodiment of the present disclosure.

FIG. 15 is a cross-sectional view schematically illustrating an example of a semiconductor package using the semiconductor element in the example embodiment described above. A semiconductor package 200 shown here has substantially the same configuration as that of the semiconductor module described above except that the semiconductor element 10 is connected to a lead frame 201 through a conductive connecting layer 203. Thus, the conductive connecting layer 203 of, e.g., solder or a conductive adhesive is disposed on the lead frame 201, and the conductive connecting layer 203 connects the lead frame 201 to the metal electrode layer 15 over the back surface of the semiconductor element 10. The conductive connecting layer 203 is disposed under the notch 20, and therefore, the thickness of the conductive connecting layer 203 in a region under the notch 20 is larger than that in a region under the middle portion of the back surface of the semiconductor element 10. A wire 204 connects another lead frame 205 to the circuit element layer 13 on the front surface of the semiconductor element 10.

The configuration of FIG. 15, as well as in the above-described embodiment, reduces delamination of the metal electrode layer 15 from the back surface of the semiconductor element 10. The conductive connecting layer 203 has a larger thickness in the region thereof under the notch 20, thereby improving reliability of the semiconductor package 200. That is because the conductive connecting layer 203 can have a lager thickness in the region under the outer peripheral portion of the chip where the thermal stress is largest to make it possible to reduce occurrence of a crack in the conductive connecting layer 203 due to the thermal stress during the operation.

The semiconductor package described above can advantageously not only stop the progress of the delamination of the metal electrode layer 15 as described in the example embodiment of the present disclosure, but also improve reliability of the semiconductor package because of the conductive connecting layer 203 having a larger thickness in the region formed under the notch 20 formed in the periphery of the back surface of the semiconductor element 10.

The present disclosure is not limited to the above embodiment, and various design modifications, etc., is possible based on the knowledge of those skilled in the art. Such a modified embodiment can also be within the scope of the present disclosure.

INDUSTRIAL APPLICABILITY

The present disclosure is suitably used for various types of semiconductor devices which require a high breakdown voltage properties and higher reliability, for example. In particular, the present disclosure is suitably used for diodes or transistors using a vertical SiC substrate.

DESCRIPTION OF REFERENCE CHARACTERS 10 semiconductor element
11 silicon carbide substrate
12 epitaxial layer (silicon carbide layer)
13 circuit element layer
13a scribe line
14 ohmic electrode layer
15 metal electrode layer
16 recess
18 sub-trench
20, 20a, 20b, 25 notch
21 corner
31 dicing film
32 blade
100 semiconductor module
101 module substrate
102 copper foil
102a, 102b, 102c interconnect layer
103, 203 conductive connecting layer

104, 204 wire
150 bottom surface
152 side surface
160, 162 tangent line
200 semiconductor package
201, 205 lead frame
300, 400 groove

The invention claimed is:

1. A semiconductor element comprising:
a silicon carbide substrate having a first main surface and a second main surface;
a silicon carbide layer disposed on the first main surface of the silicon carbide substrate;
an ohmic electrode layer disposed on the second main surface of the silicon carbide substrate; and
a metal electrode layer disposed on the ohmic electrode layer, wherein
a notch is formed along at least one pair of sides, facing each other, of a periphery of the second main surface of the silicon carbide substrate,
the ohmic electrode layer and the metal electrode layer are disposed in a region ranging from a position on the second main surface to a surface of the notch,
a cross-section of the notch orthogonal to each of the sides has a corner,
in the cross-section, a thickness of the silicon carbide substrate at an edge thereof under which the notch is formed is smaller than a thickness of the silicon carbide substrate in a region under which the notch is not formed, and larger than a thickness of the silicon carbide substrate in a region under which a bottom of the corner is formed, and
a groove is further disposed in the second main surface of the silicon carbide substrate and includes a portion which is spaced apart from the notch.

2. The semiconductor element of claim 1, wherein the corner in the notch forms an angle of less than 90 degrees.

3. The semiconductor element of claim 1, wherein the notch is formed in a whole of the periphery of the second main surface of the silicon carbide substrate.

4. The semiconductor element of claim 3, wherein a width of the notch in a cross-section passing through a diagonal line on the second main surface of the silicon carbide substrate is larger than a width of the notch in a cross-section passing through a line connecting middle points of the one pair of the sides, facing each other, of the second main surface of the silicon carbide substrate together.

5. The semiconductor element of claim 1, wherein the groove is disposed in the second main surface of the silicon carbide substrate so as to connect parts of the notch disposed along adjoining sides of the second main surface together.

* * * * *